(12) United States Patent
Narducci et al.

(10) Patent No.: US 9,178,127 B2
(45) Date of Patent: Nov. 3, 2015

(54) SEEBECK/PELTIER THERMOELECTRIC CONVERSION DEVICE EMPLOYING TREATED FILMS OF SEMICONDUCTING MATERIAL NOT REQUIRING NANOMETRIC DEFINITION

(75) Inventors: Dario Narducci, Milan (IT); Gianfranco Cerofolini, Milan (IT)

(73) Assignee: Consorzio Delta Ti Research, Milan (IT)

( * ) Notice: Subject to any disclaimer, the term of this patent is extended or adjusted under 35 U.S.C. 154(b) by 962 days.

(21) Appl. No.: 13/384,079

(22) PCT Filed: Jul. 14, 2010

(86) PCT No.: PCT/IB2010/001729
§ 371 (c)(1),
(2), (4) Date: Mar. 26, 2012

(87) PCT Pub. No.: WO2011/007241
PCT Pub. Date: Jan. 20, 2011

(65) Prior Publication Data
US 2012/0174954 A1    Jul. 12, 2012

(30) Foreign Application Priority Data
Jul. 15, 2009    (IT) .............................. VA2009A0050

(51) Int. Cl.
| | | |
|---|---|---|
| H01L 35/22 | (2006.01) | |
| H01L 35/26 | (2006.01) | |
| H01L 37/02 | (2006.01) | |
| H01L 41/18 | (2006.01) | |
| H01L 35/32 | (2006.01) | |

(52) U.S. Cl.
CPC ................ *H01L 35/22* (2013.01); *H01L 35/26* (2013.01); *H01L 35/32* (2013.01); *H01L 37/025* (2013.01); *H01L 41/18* (2013.01)

(58) Field of Classification Search
CPC ......... H01L 35/22; H01L 35/26; H01L 35/32; H01L 37/025; H01L 41/18
USPC .......................................................... 136/200
See application file for complete search history.

(56) References Cited

U.S. PATENT DOCUMENTS

| | | |
|---|---|---|
| 5,864,087 A | 1/1999 | Amano et al. |
| 6,872,879 B1 | 3/2005 | Serras et al. |
| 2006/0048809 A1* | 3/2006 | Onvural ........................ 136/212 |

(Continued)

FOREIGN PATENT DOCUMENTS

| | | |
|---|---|---|
| CN | 1300446 A | 6/2001 |
| EP | 1 083 610 A1 | 3/2001 |

(Continued)

OTHER PUBLICATIONS

International Search Report issued in International Application No. PCT/IB2010/001729.

(Continued)

*Primary Examiner* — Devina Pillay
(74) *Attorney, Agent, or Firm* — Novak Druce Connolly Bove + Quigg LLP

(57) ABSTRACT

The disclosure relates to Seebeck/Peltier effect thermoelectric conversion devices and in particular devices made of stack of dielectric layers alternated to treated semiconducting layers even of large size, not requiring lithographic patterning in a nano-micrometric scale.

9 Claims, 3 Drawing Sheets

(56) References Cited

U.S. PATENT DOCUMENTS

2007/0227158 A1* 10/2007 Kuchimachi .................. 62/3.7
2008/0212625 A1*  9/2008 Yamaguchi et al. ............ 372/34
2008/0295879 A1* 12/2008 Atanackovic ................ 136/238

FOREIGN PATENT DOCUMENTS

| FR | 2 822 295 A1 | 9/2002 |
| JP | 2004-134454 A | 4/2004 |
| JP | 2004-349566 A | 12/2004 |

OTHER PUBLICATIONS

Written Opinion of the International Searching Authority issued in International Application No. PCT/IB2010/001729.
Office Action dated Jun. 10, 2014 issued in JP Application No. 2012-520117.
Office Action dated Mar. 5, 2014 and Search Report issued in CN Application No. 201080031509.2.
Office Action dated Sep. 12, 2014 issued in JP Application No. 201080031509.2.

* cited by examiner

SEEBECK/PELTIER THERMOELECTRIC CONVERSION DEVICE EMPLOYING TREATED FILMS OF SEMICONDUCTING MATERIAL NOT REQUIRING NANOMETRIC DEFINITION

CROSS REFERENCE TO RELATED APPLICATIONS

This application is a National Phase filing under 35 U.S.C. §371 of International Application No. PCT/IB2010/001729, filed Jul. 14, 2010, which claims priority to Italian Application No. VA2009A000050, filed Jul. 15, 2009. The entire contents of each of the above references are incorporated herein by reference.

BACKGROUND

1. Technical Field

The disclosure relates in general to Seebeck/Peltier effect thermoelectric conversion devices and in particular to devices using treated layers of conductive or semiconductive material deposited over a substrate by common planar techniques and with electrical contacts definable with noncritical lithographic or serigraphic techniques.

2. Reference Notions

The Seebeck effect is a thermoelectric phenomenon according to which in a difference of temperature alongwidth an elongated conductor or semiconductor generates electricity. The effect, discovered by the physicist Thomas J. Seebeck in 1821, manifests itself with the presence of a voltage difference at the two ends of a conductive bar subjected to a gradient of temperature ∇T. In a circuit including two junctions kept at different temperatures $T_1$ and $T_2$, between different materials A and B the voltage difference between the two junctions is given by:

$$V = \int_{T_1}^{T_2} [S_B(T) - S_A(T)] dT \qquad (1)$$

where: $S_A$ and $S_B$ are the Seebeck coefficients (also referred to as thermoelectric powers) relative to the two materials A and B. The voltage values are typically in the order of few μV/K. The Seebeck coefficients depend from the materials, from their absolute temperature and from their structure. The Seebeck effect may be exploited for making devices adapted to measure temperature differences, in terms of voltage differences in a circuit constituted by wires of different materials (thermocouple) or for generating electrical energy (thermopile) by connecting in series a certain number of thermocouples.

From a microscopic point of view, the charge carriers (electrons in metals, electrons and holes in semiconductors, ions in ionic conductors) diffuse when one end of the elongated conductor is at a temperature different from the temperature at the other end. The carriers at higher temperature will diffuse toward the zone at a lower temperature as long as there are different densities of carriers in the portion at lower temperature and in the portion at higher temperature of the elongated conductor. In an isolated system, equilibrium will be reached when, through a diffusion process, heat will become uniformly distributed along the whole conductor. Redistribution of thermal energy due to the movement of charge carriers contemplates a thermocurrent and of course such an electrical current will become null when the temperature of the system becomes uniform. In a system where two junctions are kept at a constant difference of temperature, also the thermocurrent will be constant and therefore a constant flux of charge carriers will be observed. Carrier mobility is reduced by scattering phenomena caused by impurities present in the lattice of the material, by structural defects and by lattice vibrations (phonons). Therefore, the Seebeck coefficient of a material depends in a significant measure from the density of impurities and of crystallographic defects beside from the phonon spectrum in the material. On the other end, locally phonons are not always in thermal equilibrium. On the contrary they move following the temperature gradient and loose energy by interacting with electrons or other carriers, as well as with the lattice defects. If the phonon-electron interaction is predominant, the phonons will tend to push electrons toward a portion of the elongated conductor loosing energy in the process, thus contributing to the electric field in the conductor film. These contribution are ever more important in the temperature range to which the phonon-electron scattering phenomenon is predominant, that is for $$T \approx \frac{1}{5}\theta_D \qquad (2)$$

where $\theta_D$ is the Debye temperature. At temperatures lower than $\theta_D$ there are fewer phonons that are available for energy transfer while at temperatures above $\theta_D$ they tend to loose energy through a succession of phonon-phonon impacts rather than through repeated phonon-electrons impacts.

It is useful to define a thermoelectric factor of merit of a material as:

$$Z = \frac{S^2 \sigma}{\kappa} \qquad (3)$$

where κ and σ are the heat conductivity and the electrical conductivity, respectively, of the material.

From a technological point of view, the use of Seebeck/Peltier effect thermoelectric converters has being considered of potentially important commercial application. More than half of the heat generated in a thermoelectric power plant is at present dissipated as low enthalpy heat. It is estimated that about 15 millions of megawatt, be dispersed in the process of energy conversion alone. Availability of Seebeck generators capable of converting even only part of such amount of low enthalpy heat in electricity would have a significative positive impact on the energy shortage problem.

Known candidates as thermoelectrically active materials generators have a rather low factor of mint. For example, in case of a thin film of n silicon, doped with $5 \times 10^{15}$ atoms of As per $cm^3$, at room temperature, $Z \approx 10^{-3}$ $K^{-1}$. Values of $ZT \approx 1$ may be obtained only with costly materials of scarce availability such as $Bi_2Te_3$ or alloys of Sb or Se, as an example. In practice, besides few uses at relatively high added value, such as for thermoelectric generation in spacecrafts, the thermoelectric generators based on massive low cost materials achieve conversion yields of the thermal power to electrical power of just about 7%. By comparison, a turbine engine is capable of converting about 20% of the thermal energy to electrical energy.

DISCUSSION OF THE PRIOR ART

Lately it has been shown [1, 2] how a system of drastically reduced size (nanowires of silicon with transversal dimensions in the order of 20 nm) and having suitably roughened surfaces, may manifest a relatively high thermoelectric factor of merit. Enhancement of the Z factor derives from a "decoupling" between the mean free path figures of phonons and electrons caused by a significant scattering of phonons at the surface of the conductive nanowire. In particular, the important contribution to heat conductivity deriving from acoustic phonons of relatively lower frequency (longer wavelength) may be almost completely eliminated, being null in the material the density of phonons of wavelength greater than the cross section dimensions of the wire. As a consequence, the heat conductivity of silicon drops from ≈150 W m$^{-1}$ K$^{-1}$ (at room temperature for massive Si) to ≈1.6 W m$^{-1}$ K$^{-1}$ (at room temperature for nanowires of Si of 20 nm in cross section). Unfortunately, these test devices made with silicon nanowires are made with techniques unsuitable to industrialization on large scale.

In a prior published patent application No. WO 2009/125317, of the same applicant, is described a method for making nanowires of elements belonging to the IV Group of the Periodic Table or of alloys thereof, without requiring the use of advanced lithographic techniques of definition in the realm of few tens of nanometers and with a great control of the surface roughness of the nanowires, adapted to modify the mean free paths of phonons and electrons by exploiting even inner cavity surfaces produced in a controlled manner within the bulk of the nanowires. The disclosed process though much simpler than the fabrication processes previously used for making nanosized elongated structures, still requires lithographic processing, anisotropic etchings and conformal deposition processes in vacuum, besides the use of polycrystalline silicon, a material having characteristics that make it less efficient for building Seebeck thermoelectric converters than monocrystalline silicon.

GENERAL DESCRIPTION OF THE INVENTION

An efficient structure of a Seebeck/Peltier effect thermoelectric conversion device has been found, which though using a polycrystalline material such as polycrystalline silicon, has a Seebeck coefficient practically equivalent to that of the monocrystalline material, by virtue of a markedly reduced heat conductivity.

These enhanced properties of the polycrystalline material make it outstandingly useful for the realization of active structures that do not require any lithographically defined patterning of the polycrystalline material nor realization of active structures of nanometric size, thus greatly simplifying the fabrication of Seebeck/Peltier devices in a determinant manner to make them commercially fabricable on a commercial scale with an enhanced power conversion yield figure.

According to an embodiment, the Seebeck/Peltier thermoelectric conversion device is made of a stack of elements of theoretically unlimited extension, each constituted by a dielectric substrate of a material having a sufficiently low heat conductivity and a film deposited thereon of a polycrystalline semiconducting material, generally of silicon, germanium or alloys thereof, doped in a way as to reduce their bulk resistivity to a value equal or lesser than 1 Ωcm. The electrically conductive film of semiconductor may be deposited by chemical deposition from vapor phase (CVD, LPCVD and similar), with thickness that may not be necessarily of few tens of nanometers as in prior art devices, but may for example, be generally comprised 200 and 600 nm. The semiconductor film is treated after deposition over the dielectric substrate and does not require any patterning to be defined on a nano/micrometric scale with lithographic techniques.

The post-deposition treatments of each deposited layer of polycrystalline semiconducting material are crystal lattice disruptive and generate a substantially uniform distribution within the bulk of the deposited and doped film of semiconducting material of lattice defects, adapted to create scattering centers having a state of charge and size that significantly favor phononic scattering without appreciably modifying electronic conductivity within the bulk of the treated semiconducting material film.

Basically, beside the doping, whether carried out from gas phase or by ion implantation of boron or other suitable dopant up to a concentration adapted to confer to the semiconducting material an electronic conductivity sufficiently high (generally corresponding to a bulk resistivity of less than 1 Ωcm), the post-deposition treatment for the generation of effective scattering centers comprise ion implantation, at relatively large fluence, with ions to be chosen according to one of the following general criteria of selection:

(a) ions of nonreactive chemical species capable of successively effusing as a gas from the crystal lattice of the semiconductor, typically ions of a noble gas such as for example helium;

(b) ions of chemical species that react with the semiconducting material generating lattice defects that will act as scattering centers and which do not remain in the crystal lattice of the semiconductor in gaseous form though effusing at least in part, part of the implanted ions remaining trapped in the crystal lattice as "decorations" of generated defects and/or of preexisting lattice defects within the bulk of the semiconducting material, as for example ions of fluorine and nitrogen;

(c) ions of chemical species that react with the semiconducting material generating nanosized segregations, such as for example oxygen ions.

Ion implantation is carried out at different kinetic energies, generally ranging between 40 keV and 120 keV and is followed by a post-implant heat treatment at a temperature generally comprised between 800 and 950° C., for a period of one or up to several hours.

Preferably, before proceeding to implant the specifically selected ions for creating scattering centers, a sacrificial film is deposited over the implant surface of the doped semiconductor layer. Such a sacrificial film has the double function of:

(a) preventing contamination of the semiconductor by impurities that may be present on the surface and which could become trapped in the semiconductor material itself through recoil phenomena during energetic ion implantation; and (b) constituting a diaphragm adapted to slow-down the accelerated ions for enhancing the conditions of uniformity of lattice modifications by ion impacts damages of the crystal lattice even in the portion of the deposited semiconductor layer. These conditions of spatial shallower surface uniformity of the damages produced in the crystal lattice of the doped semiconductor layer is important in order to ensure a substantial absence of privileged phonon migration paths, in other words heat by-pass paths in the bulk of the layer of semiconducting material after completion of the post deposition treatments.

The sacrificial film may be of a substance that can be deposited or grown on the semiconducting material with a high degree of uniformity of the film thickness. A most preferred choice for making such sacrificial film is silicon oxide though films of metallic or polymeric material could also be used satisfactorily.

The dielectric layers of a material of low heat conductivity that are interposed as isolation layers between active layers of treated semiconducting material, and of which may constitute the substrate of deposition of the semiconductor, may be of a material belonging to the group composed by a mono or multi-component glass, aerogels of silicon oxide, undoped monocrystalline or polycrystalline silicon or having a low concentration of dopant such to have a practically negligible electrical conductivity, organic polymeric materials resistant to process and operation temperatures of the conversion device, or other materials having mechanical, dielectric and heat conductivity characteristics adapted to provide for the required isolation of the active layers of treated semiconducting material.

The characteristics of low heat conductivity of the material of the isolation layers and/or their geometry must be such to minimize any residual behavior as a heat-bridge along a direction of extension of the stacked layers from a cold side surface to a hot side surface. Therefore, cellular materials such as for example aerogels and rigid expanded material are preferred. Alternative substrate materials of substantially compact structure may be provided with slots or cavities extending in a direction orthogonal to said previously referred to direction or extension of the stacked layers, in order to reduce the equivalent cross sectional area of transmission of heat. The isolation or substrate layers of the stack may be laminate composites, multilayer wafers of different materials or a wafer of one of the above-mentioned materials, wholly coated with a layer of another material, for example a monolith of an aerogel coated with a film of polycrystalline silicon (briefly polysilicon) of few tens of nanometers thickness up to several micrometers of thickness.

Opposite sides of a generally parallelepiped stack and therefore the end surfaces of the alternately stacked layers of treated semiconductor and of isolation layers, in said direction of extension of the stacked layers, coincide with opposite terminal surfaces of a thermo-electric conversion device (one constituting the cold end surface and the other the hot end surface).

Metallizations of electrical connection are formed on said opposite side surfaces of the stack in order to connect the layers of treated semiconductor to an external circuit.

The deposited metals of electrical connection over opposite ends of the stack of may connect in parallel all the treated semiconductor layers of the stack or be patterned in order to define a plurality of groups of layers that are connected in parallel, groups of layers that may then be connected in series by electrical wires welded to a metal layer on a first end side of the stack and to a disaligned metal of a different group of parallel connected layers on the opposite end side of the stack, forming a series-parallel network of groups of layers, eventually connected, through two end terminals of the device, to an external circuit.

To this end, also the flanks of the parallelepiped stack may be coated with a passivating dielectric layer over which conductive stripes of a deposited metal layer may be defined for connecting in series distinct groups of treated semiconductor layers connected in parallel to each other by conductive stripes of metal defined on the opposite end sides of the stack.

EXPERIMENTAL RESULTS, CHARACTERIZATIONS AND EXEMPLARY EMBODIMENTS

Figure 1:
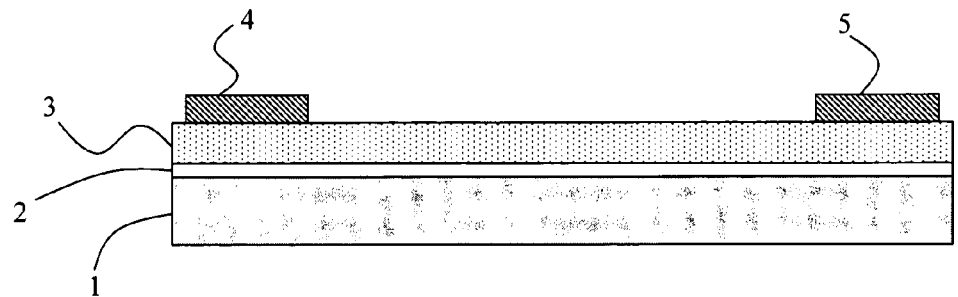
FIG. 1 is a cross section of a laboratory test structure used for characterizing the layer of treated semiconductor material according to an embodiment of the present disclosure.

The present disclosure is about the ability of the bulk of a deposited layer of a polycrystalline semiconducting material to assume uniform characteristics of marked ability to cause the scattering of phonons moving in the polycrystalline bulk, that is of substantial reduction of the contribution of phonons to heat conduction in the semiconducting material and consequently a marked increase of the Seebeck coefficient of the material, as verified in laboratory using test samples having a structure as that shown in FIG. 1.

For practicalness of preparation of samples on which it has been possible to verify the feasibility of effective energy conversion devices, a common wafer of undoped monocrystalline silicon has been used as supporting substrate.

Substrate Preparation:

by common techniques, on a massive monocrystalline silicon wafer 1, covered by a dielectric layer of relative low heat conductivity 2 of silicon oxide, having a uniform thickness of about 80 nm, grown by thermal oxidation of the substrate silicon, a thin film of polycrystalline silicon (polysilicon) 3 has been deposited with thickness of 450 nm, by chemical vapor deposition (CVD). The polysilicon layer 3 has thereafter been doped by ion implantation of boron at 60 keV, for a dopant fluence of $2 \times 10^{16}$ atoms/cm².

Ion Implantation of He+:

on the semiconducting layer of doped polycrystalline silicon 3, a sacrificial layer of Al has been deposited with thickness of 230 nm, with the double function of:

(a) preventing contamination of the semiconductor by impurities that may be present on the surface and which could become trapped in the semiconductor material itself through recoil phenomena during energetic ion implantation; and (b) favor a spatial distribution uniformity of lattice modifications by ion impacts damages even in the shallower superficial portions of the deposited doped polysilicon layer.

Figure 2:
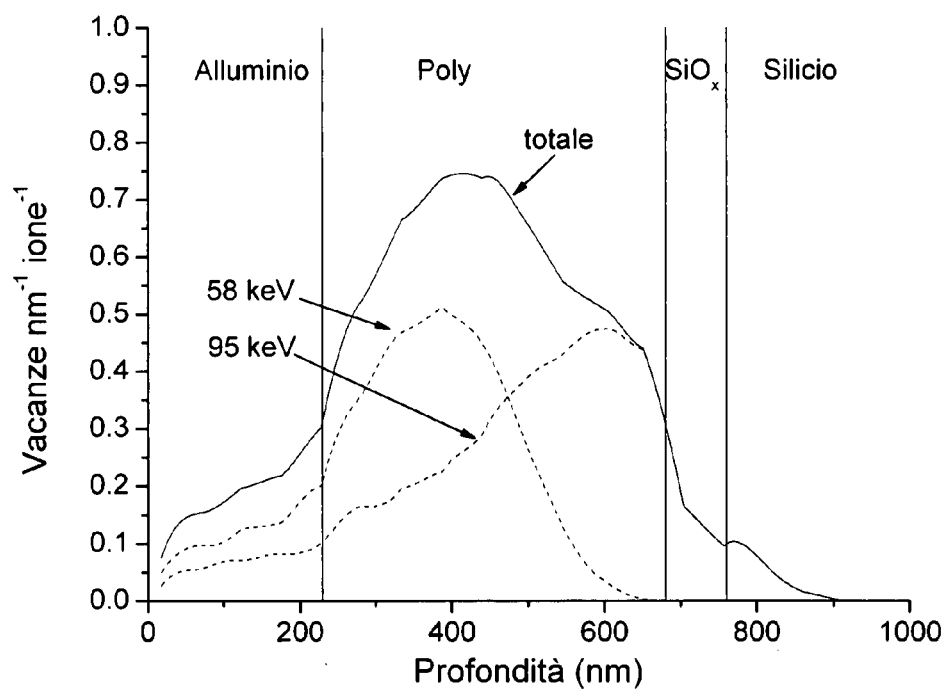
FIG. 2 shows a calculated profile of damage of the lattice of doped polycrystalline silicon subjected to repeated cycles of post deposition ion implant of disruptive effect on the crystal lattice.

The so-coated wafer has been subjected to two cycles of ion implantation of He+: (1) a first cycle of implantation with ions having a kinetic energy equivalent to 95 keV and fluence of $2.97 \times 10^{16}$ cm⁻²; (2) a second cycle of implantation with ions having a kinetic energy equivalent to 58 KeV and fluence of $1.5 \times 10^{16}$ cm⁻². The calculated resulting profile of lattice damaging as calculated is shown in FIG. 2.

Post-Implant Heat Treatment:

after having removed by dissolution the aluminum of the sacrificial layer, the doped polysilicon layer implanted with helium ions has been subjected to heat treatment at 900° C. for two hours in Argon.

Electrical Contact Deposition:

in order to test the characteristics of the active semiconducting layer of the device, on the surface of the doped polycrystalline layer 3 at two opposite sides of the film, aluminum contacts 4 and 5, separated by a distance of about 50 mm, have been formed. The current-voltage characteristics for a reference sample (R) of the same structure, the semiconducting polysilicon layer of which had not been subjected to helium ion implantation (that is prepared with only the first and fourth steps of the above-described fabrication process) and for a sample (M) subjected to helium ion implantation, were determined by forcing along the semiconducting layer a constant current and measuring the difference of potential at the two contact ends.

The Seebeck coefficient of the two samples was determined with an integral method by measuring the voltage difference $U_{th}$ that develops upon controlling the temperature of one of the two end contacts at a value $T_C=30°$ C. and varying the temperature of the other end electrode ($T_H$) from 36 to 120° C.

Given $\Delta T \equiv T_H - T_C$, the Seebeck coefficient is equal to deprivative of the curve $U_{th}$ ($\Delta T$):

$$S = \frac{dU_{th}}{d(\Delta T)}$$

In the following Table 1, the values of the electrical resistivity and of Seebeck coefficients of the reference device (sample R) and of the device according to the exemplary embodiment of the present invention (sample M), are reported.

TABLE 1

| | Electrical Resistivity | Seebeck Coefficient |
|---|---|---|
| Sample R | 1.82 mΩ × cm | 0.07 mV/K |
| Sample M | 1.45 mΩ × cm | 0.43 mV/K |

Figure 3:
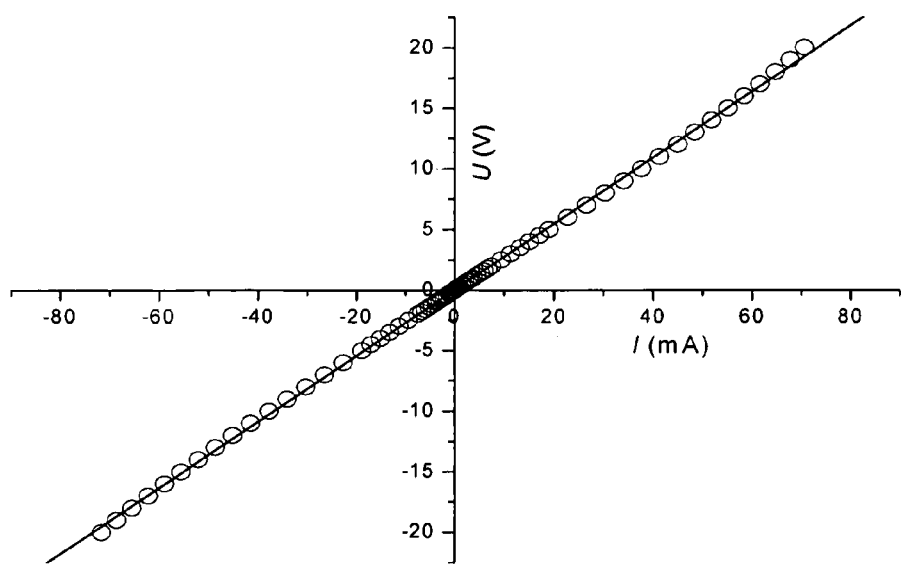
FIGS. 3 and 4 show current-voltage characteristics of doped polycrystalline silicon, treated by ionic implantation of He and subsequently subjected to heat treatment at 900° C. for two hours in Ar.

The trend of the characteristic of the sample M is shown in FIG. 3, the linearity of which demonstrates the nonrectifying character of the metal semiconductor junctions at the end contacts.

Figure 4:
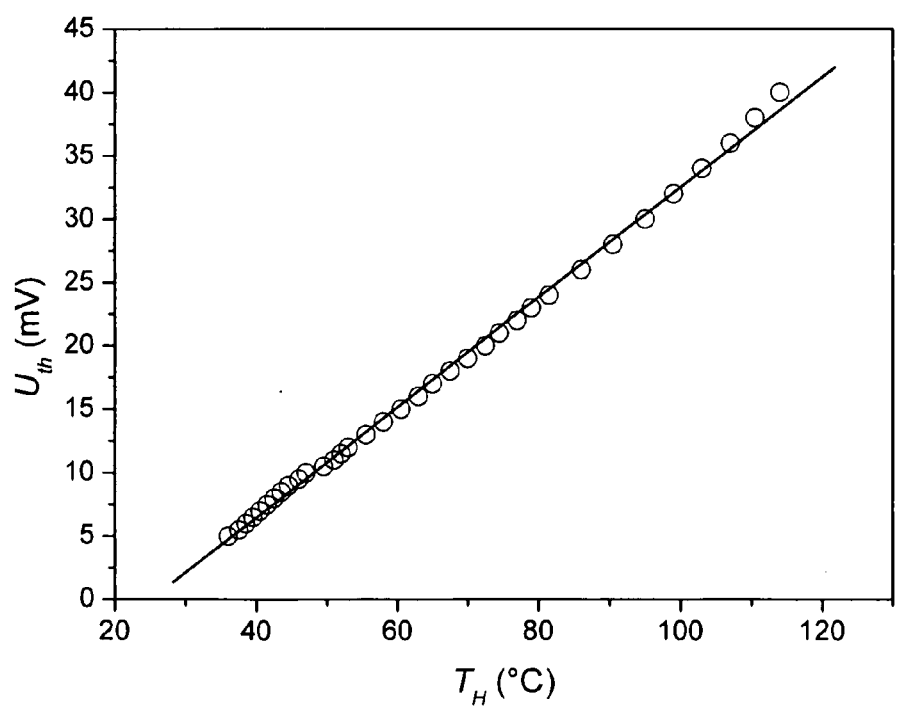

The curve $U_{th}$ ($\Delta T$) vs. $T_H$ for the sample M is shown in FIG. 4.

By comparing the values of the Seebeck coefficient of the reference sample R with that of the sample M the semiconducting layer of which had been treated according to the present invention by repeated implantation steps of helium ions at different implant conditions and subsequent heat treatment, it is outstanding the increase that is obtained for the Seebeck coefficient, by a factor ×6, that makes it comparable with the Seebeck coefficient of monocrystalline silicon of same doping, and the increase of the electrical conductivity by a factor ×1.3.

In consideration of the fact that the value of electrical conductivity of the film does not decrease, but on the contrary showed a modest increment the observed large increase of the Seebeck coefficient can be attributed to the reduction of the phononic component of heat conductivity of the material. Therefore, though it has not yet been possible to estimate such a reduction and prudently considering the value of the heat conductivity as if it had remained unchanged compared to the reference sample R, the thermoelectric factor of merit of the sample M was enhanced by an outstandingly large factor of ×50, as a result of the treatment of the doped polysilicon semiconducting layer.

Figure 5:
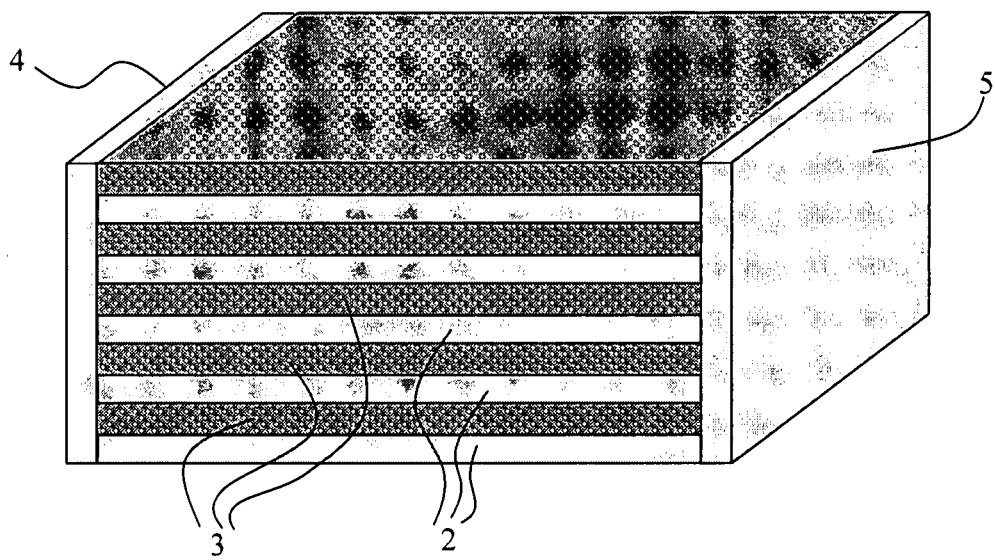
FIG. 5 is a basic architecture of a Seebeck/Peltier conversion device according to an exemplary embodiment.

FIG. 5 is a schematic view of a Seebeck/Peltier energy conversion device according to an embodiment of the present invention. The device consists in a parallelepiped stack of isolation dielectric layers of a material of low heat conductivity 2, alternated to active layers of treated semiconductor 3 of which constitute respective substrates of deposition of the polycrystalline layer of semiconducting material.

In the exemplary embodiment shown in the figure, the metallization over the opposite sides of the stack and therefore on contact end surfaces of the active layers 3, beside coinciding with the surfaces at different temperature of the device, also constitute end contacts eventually connectable in series to other devices similarly composed by a same number of active treated semiconductor layers in parallel among each other, to an electrical circuit external to the Seebeck/Peltier conversion device.

BIBLIOGRAPHY

1. A. I. Hochbaum, R. K. Chen, R. D. Delgado, W. J. Liang E. C. Garnett, M. Najarian, A. Majumdar, and P. D. Yang, 'Enhanced thermoelectric performance of rough silicon nanowires'. *Nature*, 2008, 451(7175), p. 163-167.
2. A. I. Boukai, Y. Bunimovich, J. Tahir-Kheli, J.-K. Yu, W. A. Goddard Iii, and J. R. Heath, 'Silicon nanowires as efficient thermoelectric materials'. *Nature*, 2008, 451(7175), p. 168-171.
3. D. Narducci, 'Dispositivo di conversione termo-elettrica bidirezionale ad effetto Seebeck/Peltier impiegante nanofili di materiale conduttore o semiconduttore', RM2008A000193, Italy, Apr. 11, 2008, patent pending.
4. F. Corni, C. Nobili, G. Ottaviani, R. Tonini, G. Calzolari, G. F. Cerofolini, and G. Queirolo, 'Helium in silicon: Thermal-desorption investigation of bubble precursors'. *Physical Review B*, 1997, 56(12), p. 7331-7338.
5. R. Tonini, F. Corni, S. Frabboni, G. Ottaviani, and G. F. Cerofolini, 'High-dose helium-implanted single-crystal silicon: Annealing behavior'. *Journal of Applied Physics*, 1998, 84(9), p. 4802-4808.
6. G. F. Cerofolini, G. Calzolari, F. Corni, C. Nobili, G. Ottaviani, and R. Tonini, 'Ultradense gas bubbles in hydrogen- or helium-implanted (or coimplanted) silicon'. *Materials Science and Engineering B-Solid State Materials for Advanced Technology*, 2000, 71, p. 196-202.
7. S. Frabboni, F. Corni, C. Nobili, R. Tonini, and G. Ottaviani, 'Nanovoid formation in helium-implanted single-crystal silicon studied by in situ techniques'. *Physical Review B*, 2004, 69(16), p. 165209.
8. V. Raineri, M. Saggio, and E. Rimini, 'Voids in silicon by He implantation: From basic to applications'. *Journal of Materials Research*, 2000, 15(7), p. 1449-1477.
9. V. Raineri, S. Coffa, E. Szilagyi, J. Gyulai, and E. Rimini, 'He-vacancy interactions in Si and their influence on bubble formation and evolution'. *Physical Review B*, 2000, 61(2), p. 937-945.
10. J. F. Ziegler, J. P. Biersack, and M. D. Ziegler, SRIM2008. 2008.
11. J. F. Ziegler and J. P. Biersack, SRIM—*The Stopping and Range of Ions in Matter.* 2008, Yorktown, Ion Implantation Technology Inc.

The invention claimed is:

1. A Seebeck/Peltier effect thermo-electric device comprising at least:
   a flat support of a low heat conductivity dielectric material,
   a substantially bi-dimensional semiconducting layer, deposited over at least one of the major surfaces of said support, made of a doped polycrystalline semiconducting material, having bulk electrical conductivity exceeding at least 1.0 $\Omega^{-1}\text{cm}^{-1}$, said semiconducting layer having lattice defects distributed therein adapted to constitute phononic scattering centers having a state of charge and size that favor phononic scattering, said lattice defects being obtained by implanting in-situ the polycrystalline semiconducting material with ions of a gas selected from the group consisting of Group 0 of the Periodic Table of elements, nitrogen, fluorine and oxygen, at different kinetic energies and fluencies, said doped polycrystalline semiconducting material being either doped silicon or doped germanium, patterned metallizations of electrical connection deposited along opposite sides of said semiconducting layer, said metallization being configured to an external circuit;

the Seebeck/Peltier effect thermo-electric device being configured to generate/apply a voltage difference at said opposite metallizations when opposite surfaces of the device coinciding with said patterned metallizations are at different temperatures.

2. The device according to claim 1, wherein said polycrystalline semiconducting material has phonon scattering centers uniformly distributed throughout its bulk, generated by effusion, chemical bonding or segregation of a chemical compound of the implanted element, at diversified kinetic energies and fluencies, and the polycrystalline semiconducting material.

3. The device according to claim 1, wherein one or more implantations of ions of the gas in the layer of doped polycrystalline semiconducting material is carried out through a homogeneous sacrificial layer of uniform thickness deposited over the surface of the semiconductor layer to be implanted, adapted to slow down part of the ions of the implant flux of the ions of said gas.

4. The device according to claim 1, further comprising a plurality of semiconducting layers all made of said doped polycrystalline semiconducting material alternated to dielectric layers all made of said dielectric material of low heat conductivity constituting said flat support of the layer, stacked one over the other to form a parallelepiped stack, said patterned metallizations of electrical connection deposited along opposite sides of the parallelepiped stack interconnecting groups of said layers of doped polycrystalline semiconducting material in parallel, patterned metallizations of similar groups of other layers in parallel being connected electrically in series to one another and to two electrical terminals on the whole series-parallel plurality of stacked semiconducting layers to the external circuit.

5. The device according to claim 1, wherein said gas being selected from the Group 0 of the Periodic Table of elements is helium, and wherein said doped polycrystalline semiconducting material is polycrystalline silicon of thickness comprised between 100 nm e 1.0 µm, doped with boron at a concentration exceeding $1.0 \times 10^{16}$ atoms/cm$^2$ and comprising lattice defects obtained by implanting said doped polycrystalline semiconducting material with helium ions at at least two different kinetic energies comprised between 50 and 120 KeV and for respective fluencies, summing to a overall ion fluence comprised between $1.0 \times 10^{16}$ and $5.0 \times 10^{16}$ ions/cm$^2$.

6. The device according to claim 5, wherein the layer of doped polycrystalline silicon layer is treated at a temperature comprised between 800° and 900° C. for at least an hour.

7. The device according to claim 1, wherein said flat support is of a material belonging to the group composed of mono or multi-component glass, silica aerogel, undoped silicon or having a low dopant concentration, organic polymeric materials resistant to processing and functioning temperatures of the conversion device.

8. The device according to claim 4, wherein said dielectric layers are of a stiff organic polymeric material.

9. The device according to claim 4, wherein said dielectric layers are of expanded, stiff organic polymeric material.

* * * * *